United States Patent [19]
Hariharan et al.

[11] Patent Number: 5,585,913
[45] Date of Patent: Dec. 17, 1996

[54] ULTRASHORT PULSEWIDTH LASER RANGING SYSTEM EMPLOYING A TIME GATE PRODUCING AN AUTOCORRELATION AND METHOD THEREFORE

[75] Inventors: Anand Hariharan; Donald J. Harter, both of Ann Armbor, Mich.

[73] Assignee: Imra America Inc., Ann Arbor, Mich.

[21] Appl. No.: 221,516

[22] Filed: Apr. 1, 1994

[51] Int. Cl.$^6$ .................................................. G01B 9/02
[52] U.S. Cl. ..................... 356/4.09; 356/345; 356/358; 356/349
[58] Field of Search ............... 356/4.5, 345, 349, 356/358, 359, 360

[56] References Cited

U.S. PATENT DOCUMENTS

| | | | |
|---|---|---|---|
| 3,669,541 | 6/1972 | Duguay | 356/5 |
| 4,097,148 | 6/1978 | Fry | 356/5 |
| 4,377,036 | 3/1983 | Dangschat | 356/358 |
| 4,606,639 | 8/1986 | Mottier et al. | 356/358 |
| 4,619,529 | 10/1986 | Iuchi et al. | 356/358 |
| 4,660,978 | 4/1987 | Wu | 356/359 |
| 4,708,481 | 11/1987 | Mori et al. | 356/358 |
| 4,729,653 | 3/1988 | Kobayashi | 356/4.5 |
| 4,767,197 | 8/1988 | Yeh | 350/354 |
| 4,767,210 | 8/1988 | Kashyap | 356/345 |
| 4,830,486 | 5/1989 | Goodwin | 356/5 |
| 4,886,363 | 12/1989 | Jungquist | 356/349 |
| 4,973,160 | 11/1990 | Takiguchi et al. | 356/345 |
| 4,978,219 | 12/1990 | Bessho | 356/349 |
| 5,037,206 | 8/1991 | Etzkorn et al. | 356/358 |
| 5,050,988 | 9/1991 | Sugiyama et al. | 356/358 |
| 5,106,191 | 4/1992 | Ohtsuka | 356/358 |
| 5,166,751 | 11/1992 | Massig | 356/359 |
| 5,170,217 | 12/1992 | Nishimot et al. | 356/359 |
| 5,172,186 | 12/1992 | Hosoe | 356/358 |
| 5,189,489 | 2/1993 | Brunfeld | 356/358 |
| 5,194,918 | 3/1993 | Kino et al. | 356/359 |
| 5,299,170 | 3/1994 | Shibata et al. | 356/345 |

OTHER PUBLICATIONS

"Imaging Objects Hidden in Highly Scattering Media Using Femtosecond Second–Harmonic–Generation Cross–Correlation Time Gating", Yoo et al., Optics Letters, Jul. 1, 1991, vol. 16, No. 13, pp. 1019–1021.

"Femtosecond Transillumination Optical Coherence Tomography", Hee et al., Optics Letters, vol. 18, No. 12, Jun. 15, 1993, pp. 950–952.

"Imaging With Short Optical Pulses", Diels et al., Optics and Lasers in Engineering 4, (1983) 145–165.

"Imaging With Femtosecond Pulses", Yan et al., Applied Optics, Nov. 10, 1992, vol. 31, No. 32, pp. 6869–6873.

"Femtosecond Optical Ranging in Biological Systems", Fujimoto et al., Optics Letters, vol. 11 No. 3, Mar. 1986, pp. 150–152.

"Ultrashort Light Pulses, Picosecond Techniques and Applications", Ippen, E. P. and Shank, C. V., Springer–Verlag, Berlin, Heidelberg, New York, 1977.

"Measurement of Picosecond Laser Pulse Widths", Armstrong, Applied Physics Letters, Jan. 1, 1967, vol. 10, No. 1, pp. 16–19.

"Intense Light Bursts in the Stimulated Raman Effect", Maier et al., Physical Review Letters, Dec. 26, 1966, vol. 17, No. 26, pp. 1275–1277.

(List continued on next page.)

*Primary Examiner*—Frank Gonzalez
*Assistant Examiner*—Robert Kim
*Attorney, Agent, or Firm*—Sughrue, Mion, Zinn, Macpeak & Seas

[57] ABSTRACT

An optical correlator is disclosed which, in combination with an ultrafast optical pulsed source, can be used for estimating distances of objects with submicron precision. The system includes at least one ultrafast pulsed laser source feeding into an amplitude-division device, an entity for launching pulsed radiation at the target along with an entity for collecting the radiation scattered or reflected off the surface of the object, a nonlinear device for timegating the collected signal with the amplitude-divided source, and a detection device for observing the timegated signal.

23 Claims, 6 Drawing Sheets

OTHER PUBLICATIONS

"Dynamic Stectroscopy and Subpicosecond Pulse Compression", Ippen et al., Applied Physics Letters, vol. 27, No. 9, Nov. 1975, pp. 488–490.

"CW Autocorrelation Measurements of Picosecond Laser Pulses", Sala et al., IEEE Journal of Quantum Electronics, vol. QE–16, No. 9, Sep. 1980, pp. 990–996.

"Subpicosecond–Time–Domain Reflectometry", Fontaine et al., Optics Letters, vol. 6, No. 9, Sep. 1981, pp. 405–407.

"400–Hz Mechanical Scanning Optical Delay Line", Kwong et al., Optics Letters, vol. 18, No. 7, Apr. 1, 1993, pp. 558–560.

"In Vivo Retinal Imaging by Optical Coherence Tomography", Swanson et al., Optics Letters, vol. 18, No. 21, Nov. 1, 1993, pp. 1864–1866.

"Optical Mechanical, and Thermal Properties of Barium Borate", Eimerl et al., J. Appl. Physics, vol. 62, No. 5, Sep. 1, 1987, pp. 1968–1983.

"Ultrafast Diagnostics", Diels et al., Revue Phys. Appl. 22, Dec. 1987, pp. 1605–1611.

"Control and Measurement of Ultrashort Pulse Shapes (In Amplitude and Phase) with Femtosecond Accuracy", Diels et al., Applied Optics, vol. 24, No. 9, May 1, 1985, pp. 1270–1282.

"Measurement of Ultrashort Optical Pulses with $\beta$–$BaB_2O_4$", Cheng et al., Dec. 7, 1987.

ULTRASHORT PULSEWIDTH LASER RANGING SYSTEM EMPLOYING A TIME GATE PRODUCING AN AUTOCORRELATION AND METHOD THEREFORE

BACKGROUND OF THE INVENTION

1. Field of the Invention

The invention relates to the field of ultra-short pulsewidth lasers, and particularly to the use of such lasers in distance ranging systems and similar applications, and to an autocorrelation subsystem of such a ranging device.

2. Description of the Related Art

Ultrafast laser oscillators are presently known which are capable of generating pulsewidths on the order of tens of femtoseconds with nanojoule-level pulse energies, at repetition rates as high as 100 Mhz. With this development have come attendant correlation techniques for performing diagnostics on the ultrashort laser pulses. See, e.g., E. P. Ippen and C. V. Shank in *Ultrashort Light Pulses*, ed. S. L. Shapiro; J. A. Armstrong; J. Appl. Phys., 38 2231 (1967); M. Maier, W. Kaiser and J. A. Giordmaine; Phys. Rev. Lett., 17 1275 (1966); E. P. Ippen and C. V. Shank; Appl. Phys. Lett., 27 488 (1975); K. L. Sala, G. A. Kenney-Wallace and G. E. Hall; IEEE J. Quantum Electron. 16(9) 990 (1980); J. J. Fontaine, J. -C. Diels, C-Y Wang and H. Sallaba; Opt. Lett., 6(9) 405 (1981)). In these references, it is of course the pulse itself that is the object of scrutiny.

As the field of femtosecond lasers is itself relatively new, the first applications of such lasers are just now being developed. It is one of the objects of the present invention to apply femtosecond laser technology and associated correlation techniques to the field of distance measurement (ranging), and related disciplines.

A variety of techniques exist in the prior art for the purpose of ranging between an observer and a remote object, or between two remote objects. Pulsed microwave techniques have provided the means to achieve precision to within a few centimeters over significant distances. Nanosecond pulsed laser radar techniques have provided slightly better distance resolution, down to a few millimeters. Diels et al, in Opt. & Laser Eng., 4 145 (1983), demonstrates the feasibility of using subpicosecond optical pulses to perform ranging with optical time-domain reflectometry. Others have applied this and similar techniques to the problem of imaging objects located within turbid or highly scattering media.

SUMMARY OF THE INVENTION

It is an object of the present invention to produce a distance-ranging device based on an ultrashort pulse autocorrelation technique. According to the invention, light from an ultrafast pulse source is split into reference and test beams which are subsequently recombined after the reference beam has traveled through a known optical path and the test beam has reflected from the object under measurement. A nonlinear frequency-doubling crystal is used as a timegate to obtain the autocorrelation of the signals, from which the distance to the object can be derived. In an alternative arrangement, a pair of pulse sources are used to eliminate the need for the reference arm of the autocorrelator.

BRIEF DESCRIPTION OF THE DRAWINGS

The above and other objects and advantages of the invention will become more apparent and more readily appreciated from the following detailed description of the presently preferred exemplary embodiments of the invention taken in conjunction with the accompanying drawings, of which.

DETAILED DESCRIPTION OF THE PREFERRED EMBODIMENTS

The purpose of a ranging device is to determine the distance between a fixed point in space and a test object with high precision and accuracy. In distance measurements, the ultranarrow pulsewidths from a laser source can be effectively utilized to achieve spatial resolution down to a fraction of the pulsewidth, with the time of flight of the distance to be ranged determined using timegating.

Figure 1:
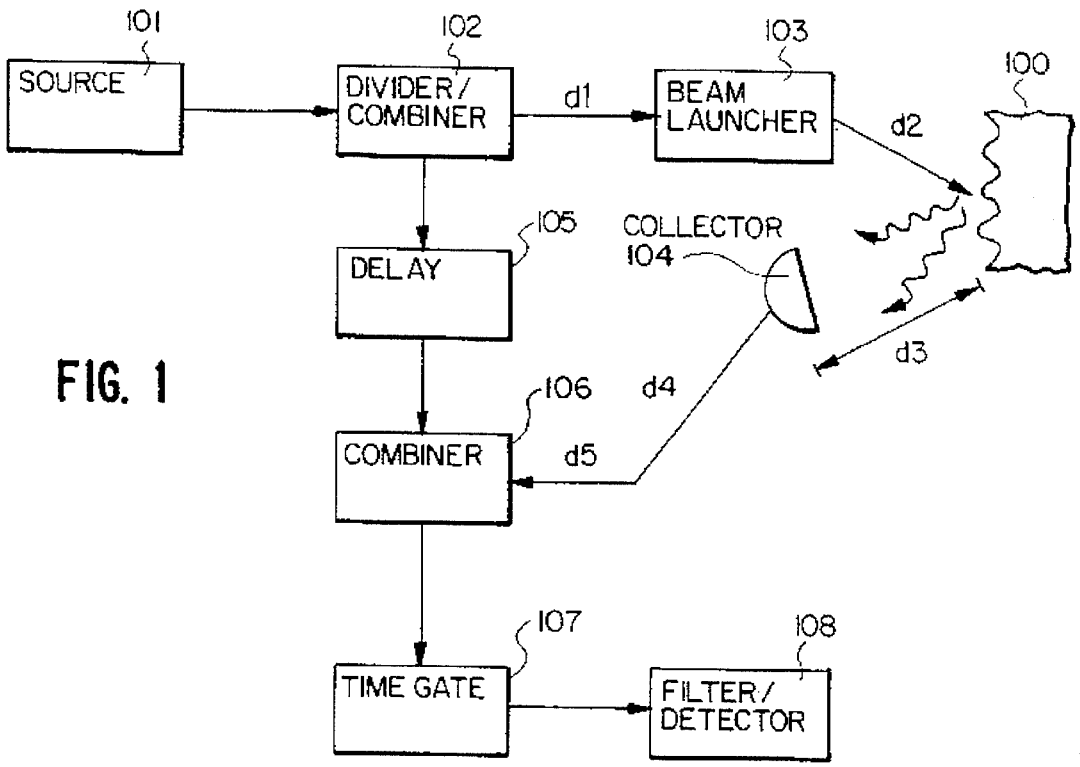
FIG. 1 illustrates a schematic of an autocorrelator with a single probe arm.

A conceptual representation of the system of the invention is shown in FIG. 1. Here, electromagnetic radiation generated by source 101 and split into reference and test pulses at divider/combiner 102 is launched at 103 to thereby traverse an optical path d1+d2+d3+d4+d5 as it emerges from beam transmitter 103, reflects/scatters at the test object 100, returns through collector 104 and recombines with the split-off reference beam at combiner 106. The time delay between amplitude division at divider 102 and recombination/timegating, at combiner 106 and nonlinear timegate 107, when accurately known, becomes a gauge of the distance Δd that can be calculated from the velocity of the electromagnetic radiation along the test optical path. When the time delay (imposed by 105) is exactly equal to the time of flight of the pulse in the optical ranging path, the pulses arriving at the amplitude combiner are coincident in time. Therefore, the timegate switches on, and a signal is recorded by the detection device 108, which may include integral filters. At all other times, the delayed pulse is not coincident with the signal pulse, and the timegate stays off and there is no output at the detection device. The signal recorded over many pulses yields the autocorrelation function of the pulse. The main quantity of interest, of course, is the time delay between the signal pulse and the reference pulse.

Figure 2:
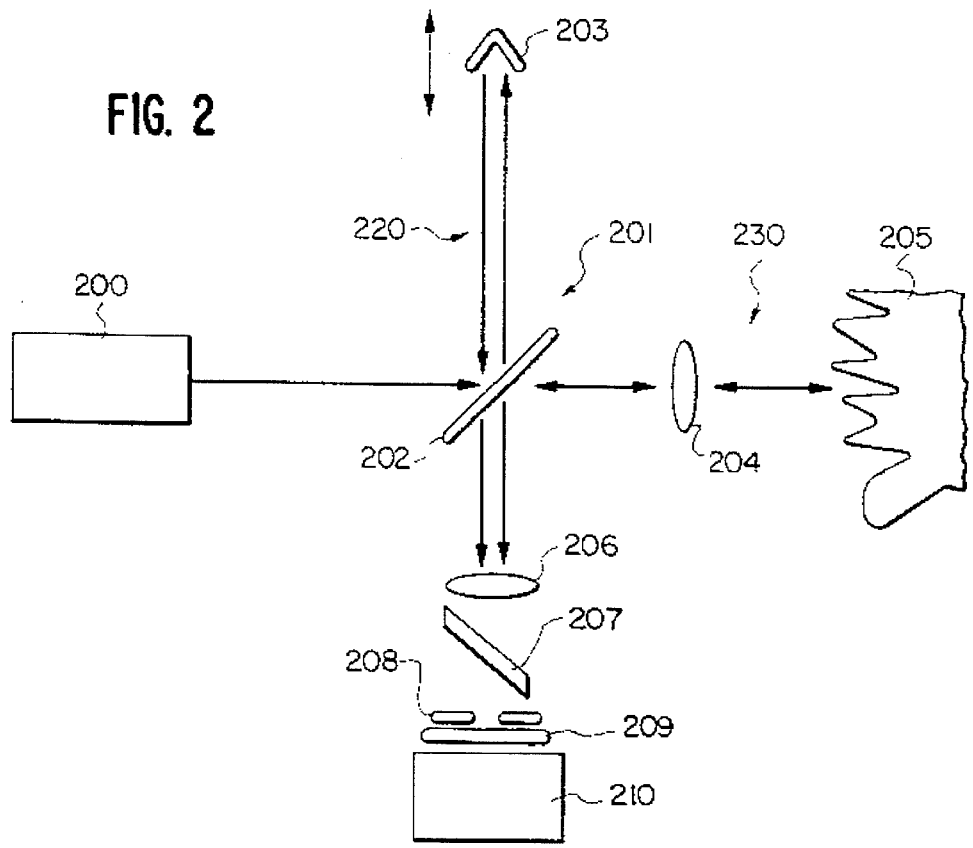
FIG. 2 shows implementation of an autocorrelator.

Referring to FIGS. 1 and 2, the system of the present invention includes a source 101 (200 in FIG. 2) of extremely short pulses of electromagnetic energy, which is preferably an ultrafast pulsed laser oscillator. The source may be selected from among many different known types; one preferred source is a modelocked visible-range titanium-doped sapphire laser which is capable of producing transform-limited pulses of 60 fs (fwhm) duration, at a 100 Mhz repitition rate, and at a wavelength of 800 nm. The laser output is polarized horizontally and has an average power of about 100 mw. Other sources of femtosecond pulses that can be used in the invention include the following: (a) Kerr lens modelocked lasers, (b) RPM, APM lasers, (c) polarization-sensitive modelocked fiber lasers, (d) actively modelocked lasers, (e) fiber, fiber-grating and fiber-prism pulse compressors that enhance bandwidth of ≈ps pulsed sources, (f) terahertz dipole antennas, (g) continuum-generated sources, (h) synchrotron sources, (i) partially coherent x-ray sources, j) microwave and RF oscillators and (k) active or passive electro-optic waveguide switches.

The output wavelength of the source may be relatively freely selected, however, the ultimate pulse width is determined by the source wavelength. The desirable output wavelength is also determined by such factors as the absorption and the temporal dispersion of the pulses in the media through which the EM energy is bound to travel. The pulses need not be transform-limited: i.e., the product of the pulsewidth and its energy bandwidth need not be a minimum as determined by Heisenberg's Uncertainty Principle. However, the magnitude and functional form of the frequency sweep present on a non-transform limited pulse has an effect on the resolution of the distance being ranged, and on the signal-to-noise ratio of the system. Resolution and/or signal-to-noise decrease with increasing frequency sweeps on the pulse.

The amplitude division and/or recombination elements 102 and 106 can be realized in a variety of ways: polarizing plate beamsplitters, polarizing cube beamsplitters, polarizing prisms such as Wollaston prisms or Glan prisms, −3 dB fiber couplers, etc. In FIG. 2 described below, the functions of both elements are combined in nonpolarizing beamsplitter 202.

The variable time delay element 105 is typically an optical delay line and is realizable in a variety of ways. Directly, the beam can be retroreflected off a retroreflecting device (203 in FIG. 2) such as a cube, or a right angle prism, so as to define a reference optical path. The retroreflecting device can be mounted on a translation stage that is driven repetitively by a triangular or other waveform. Mechanical actuators for effecting the translation could consist of electromechanical or piezoelectric transducer elements. This causes the optical path length to oscillate around a mean value. The same purpose is served by glass plates rotating in and out of the path of the reference optical beam. An optical fiber with a bend replacing the retroreflecting cube/mirror can also serve as a delay line. Another usable implementation of the delay line, as disclosed by K. F. Kwong et al; Opt. Lett., 18(7) 558 (1993)) consists of a diffraction grating and a mirror undergoing angular dither.

For obtaining the autocorrelation trace, the optical path of the reference arm is repetitively oscillated; for tracking the test arm on a real-time basis, a servo system is used to provide feedback to the translation device, which then adjusts the reference optical pathlength to maximize the correlation signal.

An implementation of the system schematically shown in FIG. 1 appears in FIG. 2. The autocorrelator includes a Michelson interferometer (201) with variable reference and test arms 200, 230. A nonpolarizing thin beamsplitter 202 of 0.5 mm thickness splits the laser beam (about 100 mW average power) into two equal amplitude components perpendicular to each other. Light in the reference arm 220 is retro-reflected off a right-angle BK-7 prism 203 mounted on a mechanical actuator with a rated maximum travel of 4 cm. An audio speaker voice coil can serve as a suitable actuator. The prism returns the incident beam and at the same time displaces it laterally by up to 10 mm. This displacement is rendered variable by mounting the entire actuator assembly on a translation stage (not shown). A sinusoidal voltage of about 20 Hz is applied across the actuator, resulting in an optical path length excursion of about 2 cm, whereby the optical path of the reference arm varies sinusoidally around some mean value by about 4 cm.

The other half of the laser beam passes through the beamsplitter and is focused onto the test surface 205 using a beam launcher/collector in the form of a convex lens (f=20 cm) 204. Real test surfaces cannot always be highly reflecting, and a large amount of scatter and therefore attenuation is expected. For example, a Lambertian scattering surface would take a beam confined in a cone angle of 28 and scatter it out into almost $2\pi$ steradian, causing more than an order of magnitude loss in signal. A relatively small focal length lens would minimize this loss, however, the selection of a too small focal length would result in a tiny confocal parameter and an attendantly small range along the optic axis over which the beam remains tightly focused. Considering the ultimate aim of measuring reasonably large changes in the position of the surface with respect to the observer, and the need for the object to be held in focus over the entire range of its position, a compromise must be struck between collection efficiency and depth of focus.

The returns from the two arms 220, 230 are rendered parallel to each other due to recombination in the beamsplitter 202, with a lateral displacement between the beams. Thereafter they are focused by a short-focal length lens (f=3 to 10 cm) 206 and directed into the timegate device 207 which here may take the form of a nonlinear frequency doubling crystal as described in detail below. In effect, the lenses 204 and 206 constitute an imaging system designed to generate a small focal spot in the crystal from the scattered signal.

In conventional reflectometry, the presence of scatter and absorption in the medium present between the ranged object and the ranging device leads to spurious signals and a degradation in performance. Timegating on the subpicosecond timescale eliminates such spurious signal from scatter, since the timegate blocks out the background signal when the gating pulse is not present. This is a considerable benefit for a practical distance ranging device, and becomes especially prominent at signal sampling intervals (i.e., pulse repetition rates) that are typically six or more orders of magnitude larger than the pulse width. Also, due to the nonlinear nature of the timegating, the technique is extremely sensitive to signal. The timegated signal is not only proportional to the signal I(t) returned from the test object, but to the correlation function $\int I(t)*I'(t+\tau)d\tau$, which is a time-correlation product of the test signal and the timegating pulse, rather than being an independent function of one or the other. In effect, a strong reference pulse will timegate virtually the entire photon energy of a weak signal pulse. The timegating pulse is made many orders of magnitude more intense than the returned signal, to ensure this high sensitivity. Due to this sensitivity, the scatter from the test surface is sufficient to obtain a timegated signal. This obviates the need for specially coated or treated reflective surfaces on the target 205 to ensure high reflectivity. Surface roughness and uncleanness are tolerated.

A preferred embodiment of the nonlinear timegate according to the invention is a second harmonic generating crystal. In this device, the nonlinear upconverter accepts two photons of the same frequency as input. The signal due to generation of the second harmonic is proportional to $$I(t)I'(t+\tau)\frac{\sin^2(\Delta k*L/2)}{(\Delta k*L/2)},$$

where $\Delta k$ is the wave vector mismatch between the two input signal beams, L is the interaction length, and I(t) are the intensity envelope functions of the pulse.

The nonlinear frequency doubling crystal preferred according to the invention is comprised of a 1.0 mm crystal of beta-barium borate (BBO). This particular crystal was chosen for its high doubling efficiency, large angle-bandwidth, relatively high damage threshold, transparency to UV and low pulse broadening due to group velocity dispersion. The BBO crystal is cut at 28 degrees with respect to the c-axis and 90 degrees with respect to the a-axis. The orientation of the crystal both along the optical axis and perpendicular to it is arranged to maximize second-harmonic signal generation. Rotation of the crystal along an axis perpendicular to the crystal and lying in a plane containing both the input beams optimizes the orientation of the crystal with respect to the polarization of the input beams. Due to the phasematching conditions discussed below, the second-harmonic signal emerges along the bisector of the angle subtended by the two beams incident on the crystal. In the crystal, a fraction of the input beam of 800 nm is frequency doubled to 400 nm. BBO is an intrinsically birefringent material: in the crystal there is only one unique direction with respect to the optic axis along which the phase velocity of the two fundamental beams is equal to that for the frequency doubled beam. This orientation condition has to be satisfied if the intensity of blue (frequency doubled) light is to grow along the length of the crystal. Along any other axis, the refractive index mismatch will cause a phase error to appear in the blue beam, and photons generated at any given point will interfere destructively with those generated at a previous point, and diminish. The condition for phasematching of the three beams is:

$$\frac{c}{n_\omega(+\theta_1)} = \frac{c}{n_\omega(-\theta_1)} = \frac{c}{n_{2\omega}(0)}$$

where $$\frac{c}{n_\omega(\pm\theta_1)}$$

is the speed of light in the crystal at the fundamental frequency and at the angles $\pm\theta_1$, $$\frac{c}{n_{2\omega}(0)}$$

is the speed of light in the crystal at the doubled frequency at the angle intersecting $\pm\theta_1$.

An aperture or iris is used to select this beam from other extraneous light. In particular, it should be noted that a certain amount of second-harmonic light is also generated collinear to each of the beams incident upon the crystal. These are carefully rejected with the aperture. Also, the shorter the focal length of the lens before the crystal, the larger the separation of the collinear frequency-doubled light from the noncollinear signal of interest, thus, better rejection is possible. Therefore, a shorter focal length is preferred as long as the two beams still overlap for the length of the crystal. Reducing the signal from the collinear components is important since this is a source of noise on the autocorrelation signal itself. As noted above, in a preferred embodiment, the peripheral blue spots accompanying the central beam are eliminated with an iris 208, and the central beam is filtered through a colored glass filter BG23, 209 to reject any fundamental beam components. The filtered beam is then detected in photomultiplier (PMT) 210. The photomultiplier may be a general purpose device, not necessarily low-noise, with a finite risetime. For display purposes the PMT output signal may be directly monitored with a digitizing oscilloscope and a time-interval counter. The signal line is terminated in 1MΩ.

If the two beams from the reference and test arms were to be made perfectly collinear rather than parallel, the autocorrelator forms an interferometric system giving rise to a rapidly oscillating "carrier frequency" modulated by a slowly varying envelope function. In this mode the resolution possible is $\frac{1}{50}$ of the wavelength of the fundamental (~800/50 nm). As an alternative to the parallel beam arrangement disclosed above, this interferometric system can be adopted, with the resulting higher resolution, when needed for a particular application. However, as interferometric measurements have system tolerances too strict for most applications, (i.e., as the interferometric system is not particularly robust), this arrangement is not the preferred mode of measurement according to the invention. Furthermore, as the collinear beams of an interferometric system give rise to an autocorrelation peak riding on a large background DC signal, the autocorrelation is obscured, and detection and measurement systems must be made increasingly discriminating as a result.

Therefore, in the preferred mode of the invention, the two beams from the reference and test arms are made to enter the crystal noncollinearly, focusing and overlapping in the crystal. When the arm lengths are perfectly matched, three spots of blue (frequency doubled) light are observed emerging from the crystal: the central spot contains the desired intensity autocorrelation; the peripheral spots are therefore masked as discussed above.

Most of the features of the system as implemented above are compatible with harsh environments. Since there is no requirement for interferometric alignment of any component, it is immune to vibration, shock and thermal stress. Alignment is simple and intuitive, and the data is conveniently accessible in a usable format.

Figure 3:
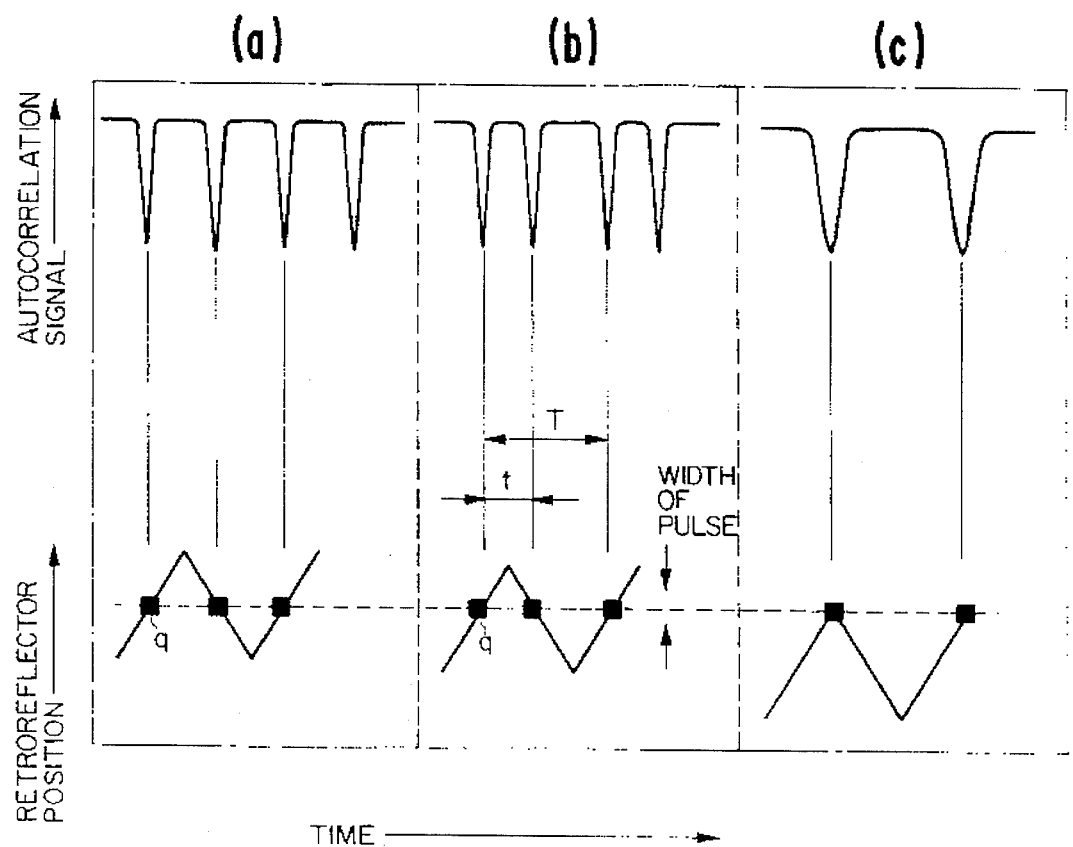
FIGS. 3(a–c) illustrate generation of the autocorrelation trace with a moving reference arm.

Referring now to FIG. 3, the generation of the autocorrelation trace and its behavior due to an oscillating reference arm is presented. In FIG. 3, the vertical axis represents the position of the retroreflector 203 in terms of the absolute length of the reference arm, whereas the horizontal axis corresponds to time. Three situations, (a) (b) and (c) have been shown, corresponding to three different lengths of the test arm (i.e., three different positions of the test object). The lower trace corresponds to the position of the retroreflector in time, and is triangular since the drive voltage to the electromechanical actuator (e.g., a voice coil) is triangular. The dotted line indicates the position of the test arm relative to the reference arm. In (a), both the arms are exactly equal. The square marks labeled "q" on the sine wave are highly exaggerated markers for the points in time over which the optical lengths of the two arms are exactly equal, and thus where a reference pulse overlaps with a signal pulse reflected from the object 205. Each "square" gives rise to a spike in the PMT output signal: this is the desired autocorrelation. The vertical length of the squares in the graph represents the laser pulse width. A 100 fs pulse occupies about 30 microns worth of linear space. The actuator travel is 2 cm, and therefore the entire oscillation amplitude of the triangle wave in the figure is 2 cm. Thus, the overlap time of the pulses is three orders of magnitude smaller than the time required for the excursion of the actuator.

This is the genesis of the autocorrelation trace in (a). As the test object moves, say, farther away from the device, the dotted line moves to a new relative position on the sine wave as in (b). The squares shift accordingly, yielding the autocorrelation trace (b). Even though "t", the separation between adjacent autocorrelation peaks, changes, the time "T", the separation between every other peak, remains constant. This is because "T" reflects the drive frequency of the actuator, which remains constant. Upon taking the test object even further, the two adjacent autocorrelation peaks coalesce as in (c), and ultimately disappear, since there is no longer any overlap between test and reference pulses. The relationship between "t" on the autocorrelation trace and the actual length of the test arm is made linear by using a triangular waveform to drive the actuator. Increasing the excursion of the reference arm will increase the limits of the ranging, which can have obvious advantages.

With a 100 MHz repetition rate of the laser source, the signal received at the PMT is an average over thousands of laser pulses rather than due to a single pulse. This is because at a 20 Hz repetition rate, the retroreflector travels 2 cm over 25 ms, i.e., 30 microns in 24 μs. With one pulse coming from the laser every 10 ns, 2400 laser pulses constitute the 24 μs overlap time. Stated differently, 2400 laser pulses will be emitted during the period of time it takes the retroreflector to move the physical distance corresponding to one laser pulse. Decreasing the repetition rate of the actuator will increase signal-to-noise, since a larger number of laser pulses would be averaged over. This would also increase overall acquisition time, and therefore affect overall system response to changes in the position of the test object. The detection limit achieved by the inventors is 10 photons per pulse, and a noise-equivalent-power of the order of 1 pw/(Hz)$^{1/2}$ has been measured.

Figure 5:
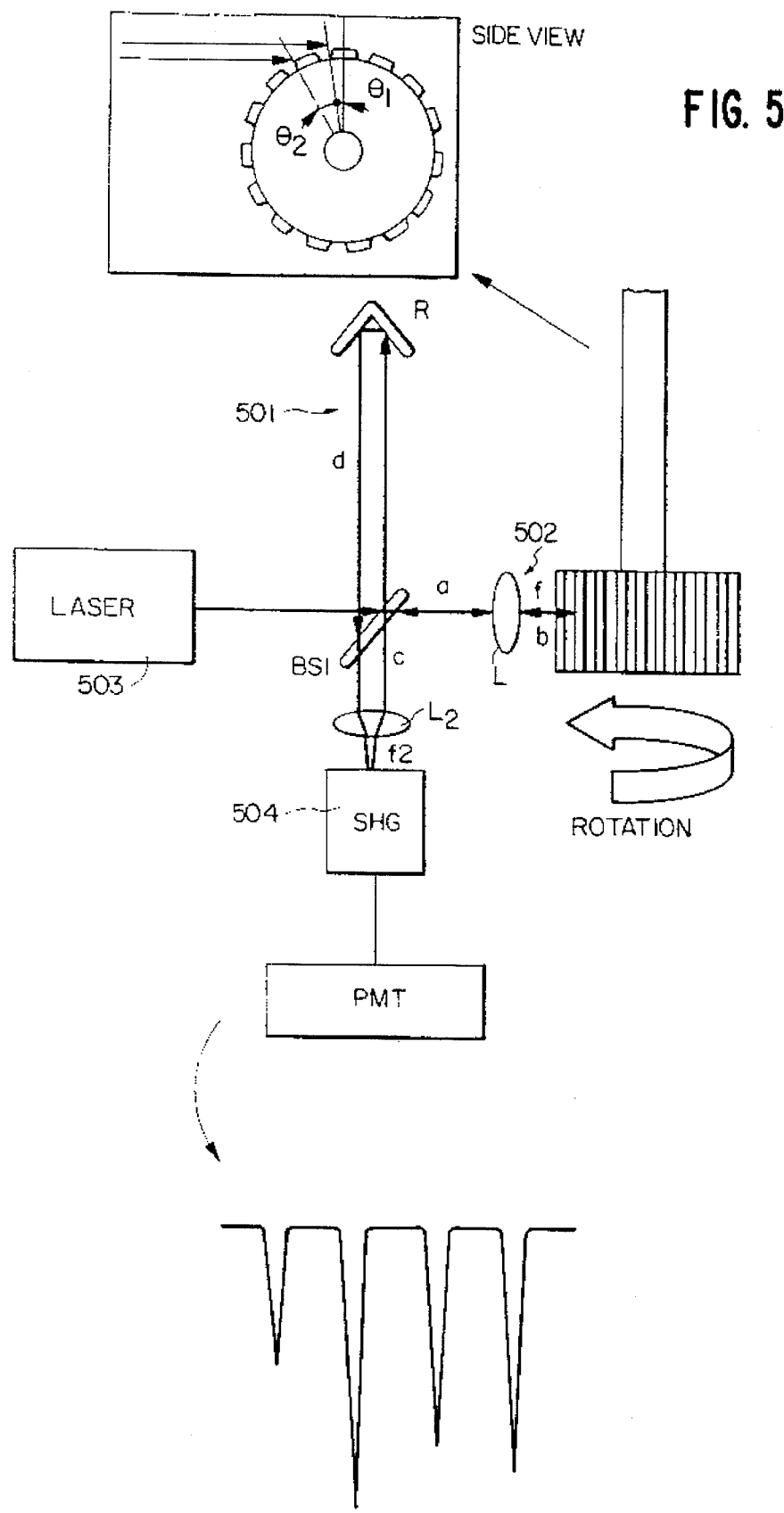
FIG. 5 shows RPM measurement of a gear mounted on a shaft.

FIG. 5 illustrates an embodiment of the invention where the ranging apparatus is used to obtain a measure of the angular velocity of a rotating shaft, by utilizing the displacement along an arc of an object such as a gear mounted on the shaft. This embodiment is especially useful for real-time noncontact measurement on a torque transmitting system, and is immune to atmospheric scatter and attenuation. The technique is sufficiently sensitive that the scatter from an untreated surface is sufficient to provide a measurement signal.

In this embodiment, the autocorrelator includes a nonpolarizing beamsplitter BSI which splits the laser beam into two equal amplitude components for the variable reference and test arms 501, 502 as shown. An ultrafast laser source 503 generates pulses with widths typically in the tens of femtoseconds. Light from the reference arm is retro-reflected back to the beamsplitter. In this particular embodiment the optical path length of the reference arm can be constant, in contrast to the technique illustrated in FIG. 2, since the path length of the measurement arm will necessarily oscillate. Therefore, for this particular application, the voice coil or other translation mechanism is unnecessary. The measurement half of the laser beam impinges on a spur gear G mounted on a shaft transmitting the angular motion/torque. Light scattered from the front of a tooth on the gear is collected by lens L of focal length f, and coupled back into the beamsplitter. The incident probe beam strikes the front surface of a tooth on the gear at a height from the axis of the shaft such that the scatter back into L is maximum. The geometry of the gear dictates, however, that the front face of the tooth under investigation be within the field of view of the test beam over a distance not exceeding the depth of focus. In the inset in FIG. 5, at $\theta > \theta_1$, the tooth in front of the one under examination obstructs the laser beam. For $\theta > \theta_1$, the tooth is too low to remain within the field of view of the test beam.

Lens L has sufficiently long focal length that the depth-of-focus covers the estimated range of the displacement of the teeth on the gear. For an optimum autocorrelation signal, tight focusing into the nonlinear crystal dictates that path lengths $a+b+c \approx f+f2$, where f2 is the focal length of lens L2. The returns from the two arms are therefore rendered parallel to each other with a lateral displacement between the beams. Thereafter they are focussed into the nonlinear crystal, which produces nonlinear frequency doubling of the incident light. The functional form of the intensity of the doubled light in time is the autocorrelation of the envelope functions of the pulses contributing to the doubled light. The autocorrelation trace for the rotating gear has been plotted against time at the bottom of FIG. 5. When the arm lengths are perfectly matched, and when the nonlinear crystal is appropriately phase-matched for doubling, three spots of blue light emerge from the crystal: the central spot contains the desired intensity autocorrelation, and is detected with a photomultiplier. Due to the sensitivity of the autocorrelation technique, the scatter from the "native" surface under test is sufficient to obtain an autocorrelation signal. This obviates the need for a reflective surface, special reflective coatings or retroreflector elements attached to the surface. Even surface roughness is tolerated. Cleanliness of the surface is not necessary, allowing for grease, dirt, oil films, etc. on the surface. Since there is no requirement for interferometric alignment of any component, the system is immune to vibration, shock and thermal stress. Alignment is simple and intuitive, and the data is conveniently accessible in a usable format.

As shown, the reference arm is kept stationary, and signal from the teeth are collected. A pulsed signal is observed from every tooth. The number of teeth counted per unit time provides a velocity value. Alternatively, if the risetime and falltime of the pulse are measured for each tooth, the velocity with which the pulse trains intersecting in the nonlinear conversion device pass each other can be calculated, and thus the linear tangential velocity of the tooth. With the number of teeth known, the angular frequency can be deduced.

Figure 6:
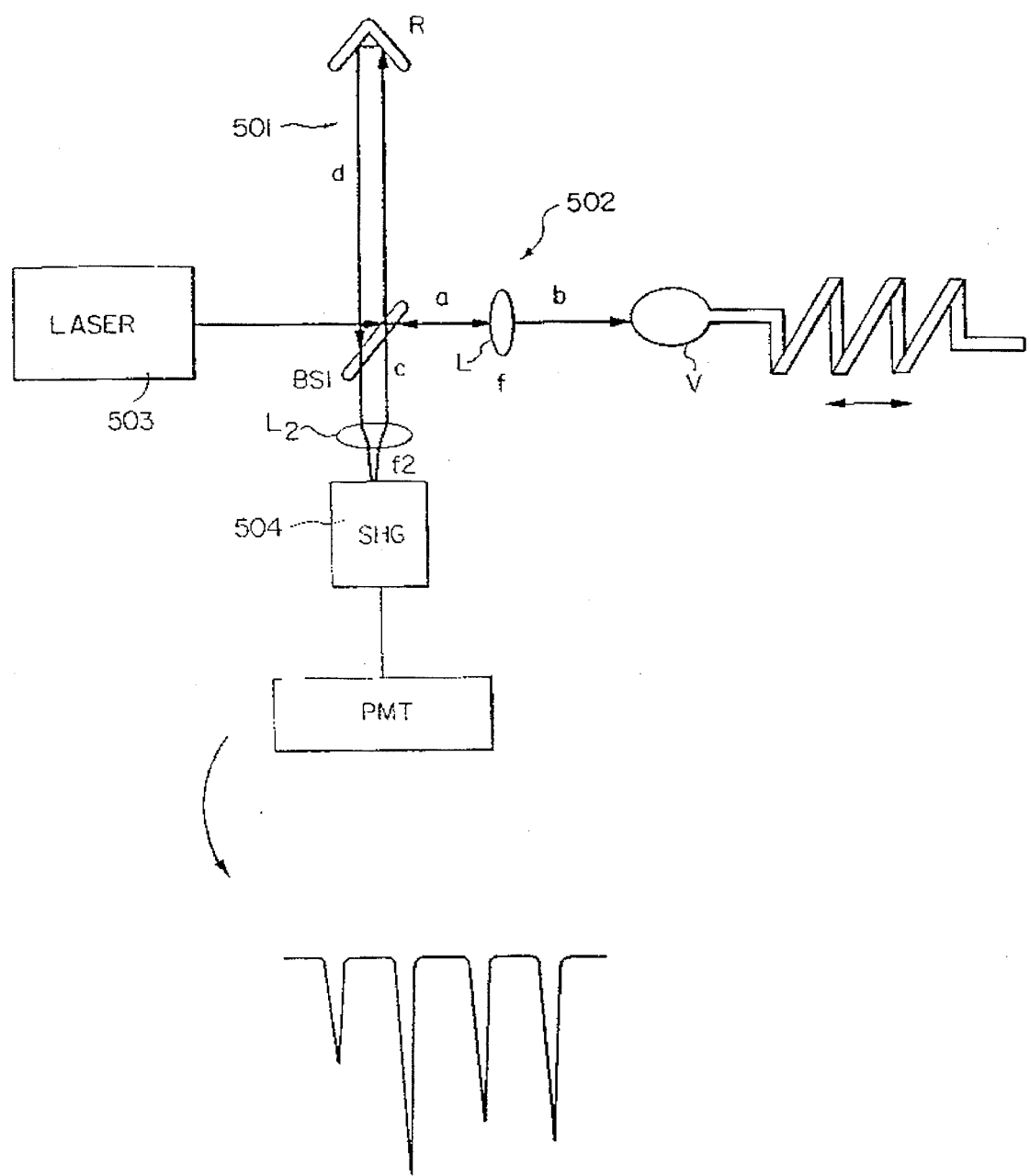
FIG. 6 shows an apparatus for measuring vibration.
Figure 6A:
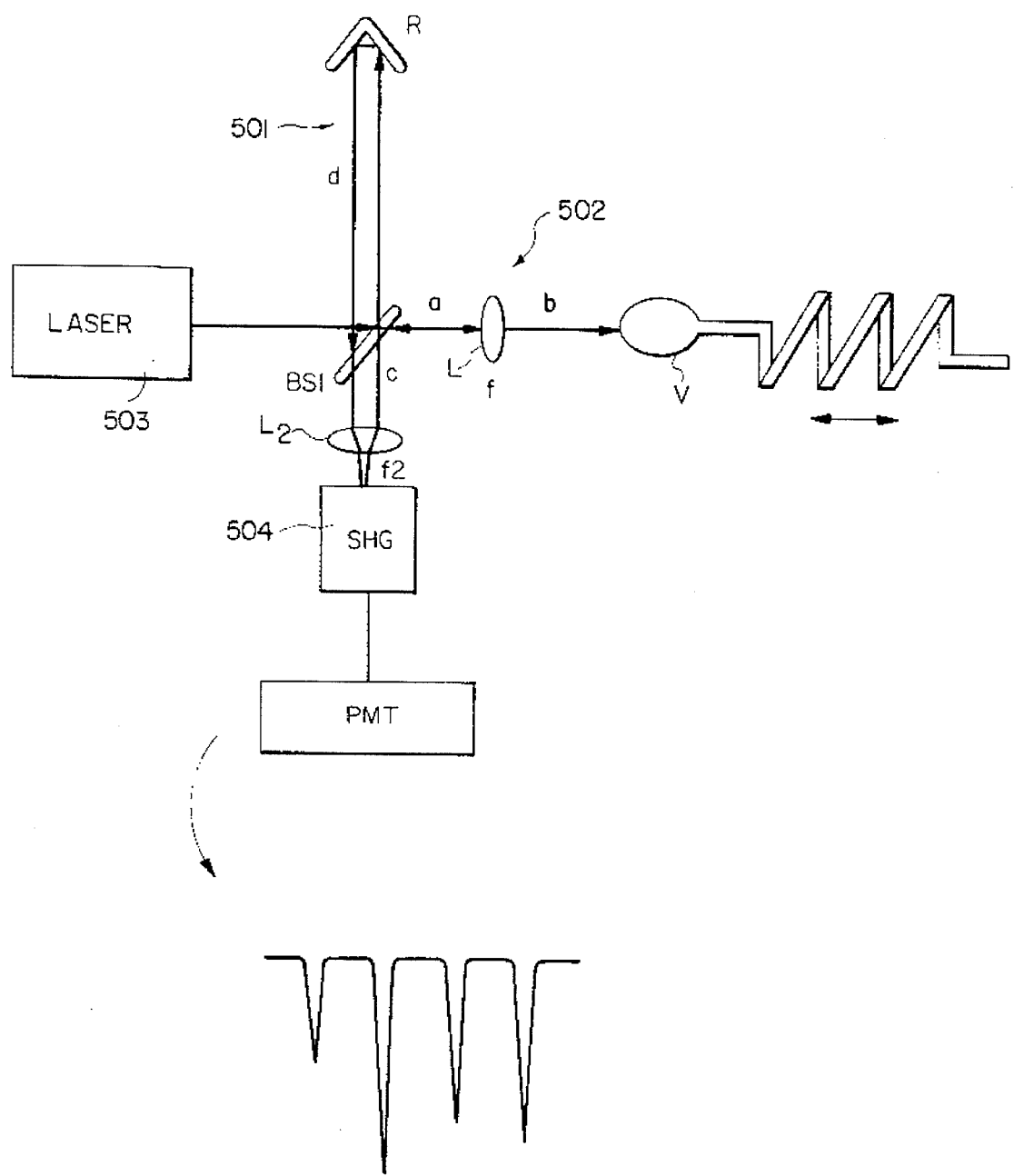
Figure 6B:
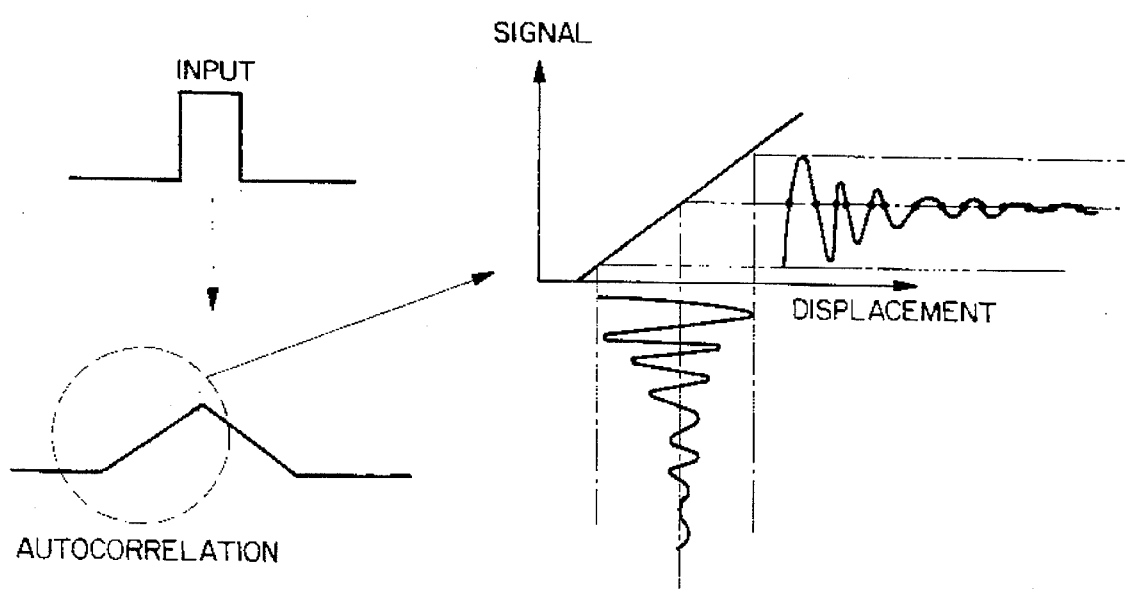

Another embodiment of the invention is shown in FIG. 6, wherein measurement of a repetitive or oscillatory motion, vibrational frequency, amplitude and damping constant can be measured using a surface ranging technique. Mechanical vibrations of only a few microns amplitude can be accurately measured. In FIG. 6, the same elements as in FIG. 5 are similarly labeled. The only significant difference resides in that the test beam is now directed to the body of the vibrating element V from which scatter is collected and autocorrelated with the reference pulse. When the pulses are short compared to the vibration displacement, then single points are obtained when the lengths of the two arms are equal. Each of the points drawn on the trace of the oscillation signal at right represents one autocorrelation pulse. The reference arm of the autocorrelator is held constant as in FIG. 5. The resulting signal is a train of autocorrelation pulses of approximately equal amplitude, but with the separation varying in time. This variation in time corresponds to when the path length of the test arm becomes periodically equal to that of the reference arm. This equivalence can take place at any point in the excursion of the vibrating body. The time variation between the autocorrelation peaks can be fit mathematically to a decaying sinusoidal function, and parameters such as vibrational frequency, damping constant and anharmonicity can be determined.

Figure 4:
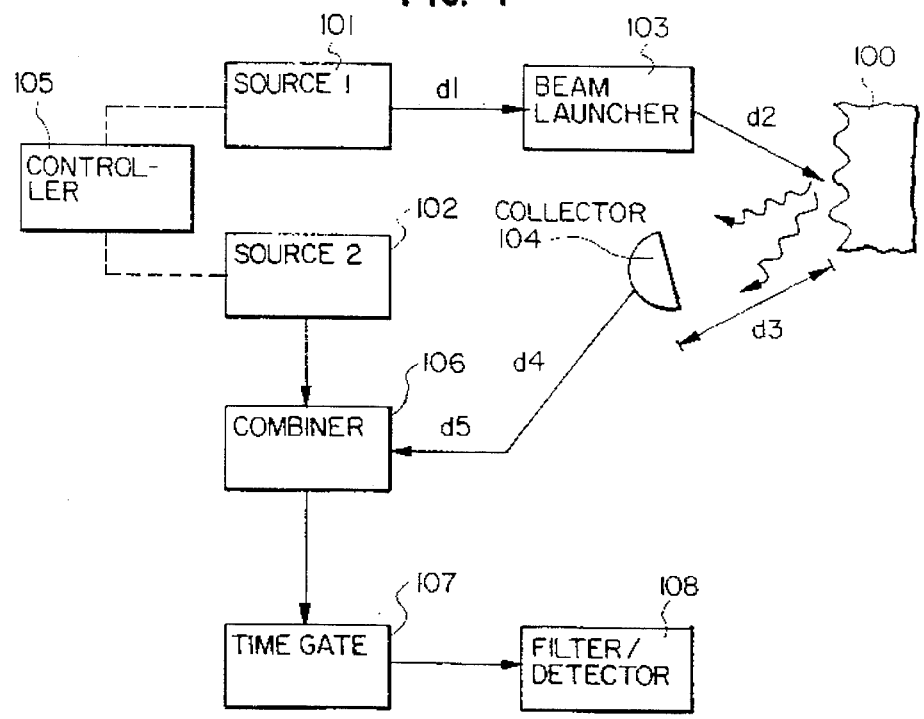
FIG. 4 shows two ultrafast sources used to produce time-variation absent the reference arm.

A further embodiment according to the invention is schematically illustrated in FIG. 4. In this technique, dual-pulse sources, i.e., two ultrafast pulsed sources, are used at different repetition rates, to eliminate the need for a reciprocating reference arm. Numerals 101 and 102 represent two sources generating ultrafast pulses at repetition rates $f_1$, and $f_2$ respectively. Therefore, there is a temporal coincidence of pulses from the two sources at a frequency of $(f_1-f_2)$ Hz.

This corresponds to a minimum time delay between adjacent pulses corresponding to $$t_1 - t_2 = \frac{1}{f_1} - \frac{1}{f_2}.$$

This corresponds to a distance of $c(t_1-t_2 2)$.

If the pulse width is $\tau_1$, then $t_1-t_2<\tau_1$, so that there is at least one coincidence between the two pulse trains. Control device 105 controls the repetition rates of the two pulse sources. Typically, the pulse sources are ultrafast lasers; the repetition rate of one laser is kept constant, and that of the other is varied by varying the cavity round-trip time using a PZT driven mirror (not shown). Controller 105 in this case monitors the frequency f1 and changes the cavity length of the second laser until the repetition rate f2 is achieved from the second laser. If 101 and 102 are electronically controlled (such as diode lasers), their frequencies can be directly controlled via the drivers of the devices. (However, electronic control of diode lasers has timing jitter limitations).

If a sufficient number of pulses do not overlap during one "pass" there is a decrease in the signal due to a lower sampling rate, and in the absence of averaging, more noise.

Further in FIG. 4, 106 is the amplitude combination device, 103 is a beam launching device (lens), and 104 is a signal collection device (lens). The nonlinear material (typically a BBO crystal) is indicated by 107, and 108 represents the filters and detection device.

Although several exemplary embodiments have been herein shown and described, those of skill in the art will recognize that many modifications and variations are possible, and it is intended to measure the invention only by the appended claims.

What is claimed is:

1. An apparatus for measuring a distance to at least one object, comprising:

at least first and second distinct source means for generating pulsed light beams of ultrashort pulsewidth;

means for directing a first, measurement beam to said object and collecting a reflected beam;

means for directing a second, reference beam along a reference optical path;

means for controlling repetition rates of said first and second source means, so as to control a frequency of temporal coincidence of said pulsed light beams;

means for combining said reference and reflected beams and directing said beams to a timegate; and means for determining a distance to said object from the output generated by said timegate.

2. An apparatus as claimed in claim 1, wherein said combining means directs said beams to said timegate in parallel fashion, and including means for overlapping said beams within said timegate.

3. An apparatus as claimed in claim 2, wherein said timegate comprises a non-linear optical crystal.

4. An apparatus as claimed in claim 1, wherein said distance determining means includes means for comparing a time-of-flight of said reference beam with a time-of-flight of said measurement beam.

5. An apparatus as claimed in claim 1, wherein said timegate comprises a non-linear frequency doubling crystal, which, when said reference beam and said measurement beam are applied thereto, produces an autocorrelation function of said beams having maxima at locations where the pulses of said beams are coincident in time.

6. An apparatus for measuring a distance to at least one object, comprising:

at least first and second distinct source means for generating pulsed light beams of ultrashort pulsewidth, at at least two distinct wavelengths;

means for directing a first, measurement beam to said object and collecting a reflected beam;

means for directing a second, reference beam along a reference optical path;

means for combining said reference and reflected beams and directing said beams to a timegate; and means for determining a distance to said object from the output generated by said timegate.

7. An apparatus as claimed in claim 6, wherein said combining means directs said beams to said timegate in parallel fashion, and including means for overlapping said beams within said timegate.

8. An apparatus as claimed in claim 7, wherein said timegate comprises a non-linear optical crystal.

9. An apparatus as claimed in claim 8, wherein said timegate timegates the input signals on a subpicosecond timescale.

10. An apparatus as claimed in claim 9, wherein said timegate outputs a timegate signal proportional to both the reflected beam and to a time-correlation product of the reflected beam and the reference beam.

11. An apparatus as claimed in claim 10, wherein said timegate timegates virtually an entire photon energy of the reflected beam, providing high sensitivity.

12. An apparatus as claimed in claim 8, wherein said optical crystal is comprised of a beta-barium borate crystal approximately 1.0 mm in thickness.

13. An apparatus as claimed in claim 8, wherein said means for combining comprises a lens having a relatively short focal length.

14. An apparatus as claimed in claim 6, wherein said distance determining means includes means for comparing a time-of-flight of said reference beam with a time-of-flight of said measurement beam.

15. An apparatus as claimed in claim 6, wherein said timegate comprises a non-linear frequency doubling crystal, which, when said reference beam and said measurement beam are applied thereto, produces an autocorrelation function of said beams having maxima at locations where the pulses of said beams are coincident in time.

16. An apparatus as claimed in claim 6, further comprising an aperture for rejecting extraneous light from the combined reference and reflected beams, including second harmonics of the combined beams.

17. An apparatus as claimed in claim 6, wherein said ultrashort pulsewidth is on the order of 100 fs.

18. An apparatus as claimed in claim 6, wherein said object has a rough component.

19. An apparatus as claimed in claim 6, wherein said object has an unclear component.

20. An apparatus as claimed in claim 6, wherein said object is a rotating shaft.

21. An apparatus as claimed in claim 6, wherein said object is a vibrating element.

22. An apparatus for measuring an instantaneous distance to, or tracking the motions of, a vibratory object, comprising:

means for generating a pulsed light beam of ultrashort pulsewidth;

means for dividing said light beam into a reference beam and a measurement beam;

means for directing said measurement beam to said object and collecting a reflected beam;

means for combining said reference and reflected beams and directing said beams to a timegate;

means for determining a distance to said object from the output generated by said timegate;

said reference beam traveling along a reference path of fixed length, and said measurement beam traveling along a measurement path having a length which varies with the vibration of said object; said distance determining means including means for mathematically fitting successive autocorrelation maxima to a sinusoidal function to thereby determine at least a vibrational frequency of said object.

23. An apparatus for measuring an instantaneous distance to, or tracking the motion of, a rotating object, comprising:

means for generating a pulsed light beam of ultrashort pulsewidth;

means for dividing said light beam into a reference beam and a measurement beam;

means for directing said measurement beam to said object and collecting a reflected beam;

means for combining said reference and reflected beams and directing said beams to a timegate;

means for determining a distance to said object from the output generated by said timegate; and wherein said reference beam travels along a reference path of fixed length, and wherein said measurement beam travels along a measurement path having a length which varies with the movement of said object; said rotating object comprising a rotating body having at least one portion susceptible to reflection/scatter of said measurement beam as said object rotates, and said distance determining means including means for calculating a velocity value in accordance with the timing of the reflection of said measurement beam.

* * * * *